(12) United States Patent
Cheah et al.

(10) Patent No.: US 8,987,896 B2
(45) Date of Patent: Mar. 24, 2015

(54) HIGH-DENSITY INTER-PACKAGE CONNECTIONS FOR ULTRA-THIN PACKAGE-ON-PACKAGE STRUCTURES, AND PROCESSES OF FORMING SAME

(75) Inventors: Bok Eng Cheah, Bayan Lepas (MY); Shanggar Periaman, Georgetown (MY); Kooi Chi Ooi, Georgetown (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/890,345

(22) Filed: Sep. 24, 2010

(65) Prior Publication Data
US 2011/0140268 A1    Jun. 16, 2011

(30) Foreign Application Priority Data
Dec. 16, 2009 (MY) .................. PI20095412

(51) Int. Cl.
| | | |
|---|---|---|
| *H01L 23/48* | (2006.01) | |
| *H01L 23/498* | (2006.01) | |
| *H01L 23/00* | (2006.01) | |
| *H01L 25/065* | (2006.01) | |
| *H01L 25/10* | (2006.01) | |

(52) U.S. Cl.
CPC .......... *H01L 23/49833* (2013.01); *H01L 24/97* (2013.01); *H01L 25/0655* (2013.01); *H01L 25/105* (2013.01); *H01L 23/49816* (2013.01); *H01L 24/13* (2013.01); *H01L 24/45* (2013.01); *H01L 25/0657* (2013.01); *H01L 2224/16225* (2013.01); *H01L 2224/48091* (2013.01); *H01L 2224/48227* (2013.01); *H01L 2224/73265* (2013.01); *H01L 2224/97* (2013.01); *H01L 2225/0651* (2013.01); *H01L 2924/01029* (2013.01); *H01L 2924/01078* (2013.01); *H01L 2924/09701* (2013.01); *H01L 2924/14* (2013.01); *H01L 2924/1433* (2013.01); *H01L 2924/15311* (2013.01); *H01L 24/48* (2013.01); *H01L 2924/01005* (2013.01); *H01L 2924/01006* (2013.01); *H01L 2924/01033* (2013.01); *H01L 2924/014* (2013.01); *H01L 2224/32225* (2013.01); *H01L 2224/73204* (2013.01); *H01L 2224/32145* (2013.01); *H01L 2225/1023* (2013.01); *H01L 2225/1041* (2013.01); *H01L 2225/1058* (2013.01); *H01L 2224/45* (2013.01)
USPC ........................................................ 257/724

(58) Field of Classification Search
USPC ............ 257/690, 723, 724, 737, 777, E23.01, 257/E23.141
See application file for complete search history.

(56) References Cited

U.S. PATENT DOCUMENTS

| | | | | |
|---|---|---|---|---|
| 5,790,384 | A * | 8/1998 | Ahmad et al. ................ | 361/760 |
| 5,977,640 | A * | 11/1999 | Bertin et al. ................... | 257/777 |
| 6,376,917 | B1 * | 4/2002 | Takeshita et al. .............. | 257/778 |
| 6,618,267 | B1 * | 9/2003 | Dalal et al. .................... | 361/767 |
| 7,573,136 | B2 * | 8/2009 | Jiang et al. .................... | 257/777 |
| 7,671,457 | B1 * | 3/2010 | Hiner et al. .................... | 257/678 |
| 7,800,212 | B2 * | 9/2010 | Yoon et al. ..................... | 257/686 |

(Continued)

*Primary Examiner* — Michele Fan
(74) *Attorney, Agent, or Firm* — John N. Greaves

(57) ABSTRACT

An apparatus includes a coreless mounting substrate and an interposer disposed on the coreless mounting substrate with a chip disposed in a recess in the interposer and upon the coreless substrate. The apparatus may include an inter-package solder bump in contact with an interconnect channel in the interposer, and a top chip package including a top package substrate and a top die disposed on the top package substrate. The top package substrate is in contact with the inter-package solder bump.

3 Claims, 11 Drawing Sheets

(56) References Cited

U.S. PATENT DOCUMENTS

| | | |
|---|---|---|
| 7,911,046 B2 * | 3/2011 | Cablao et al. .................. 257/686 |
| 7,952,182 B2 * | 5/2011 | Watts et al. ................... 257/686 |
| 2003/0230801 A1 * | 12/2003 | Jiang et al. .................... 257/723 |
| 2006/0113653 A1 * | 6/2006 | Xiaoqi et al. .................. 257/686 |
| 2006/0255449 A1 * | 11/2006 | Lee et al. ...................... 257/698 |
| 2008/0265391 A1 * | 10/2008 | Sterrett et al. ................. 257/686 |
| 2008/0308950 A1 * | 12/2008 | Yoo et al. ...................... 257/778 |
| 2009/0152701 A1 * | 6/2009 | Kuan et al. ..................... 257/686 |
| 2009/0243072 A1 * | 10/2009 | Ha et al. ........................ 257/686 |
| 2010/0044878 A1 * | 2/2010 | Ha et al. ........................ 257/777 |
| 2010/0327419 A1 * | 12/2010 | Muthukumar et al. ....... 257/686 |
| 2011/0140283 A1 * | 6/2011 | Chandra et al. ............... 257/777 |
| 2011/0215470 A1 * | 9/2011 | Chen et al. ..................... 257/738 |

* cited by examiner

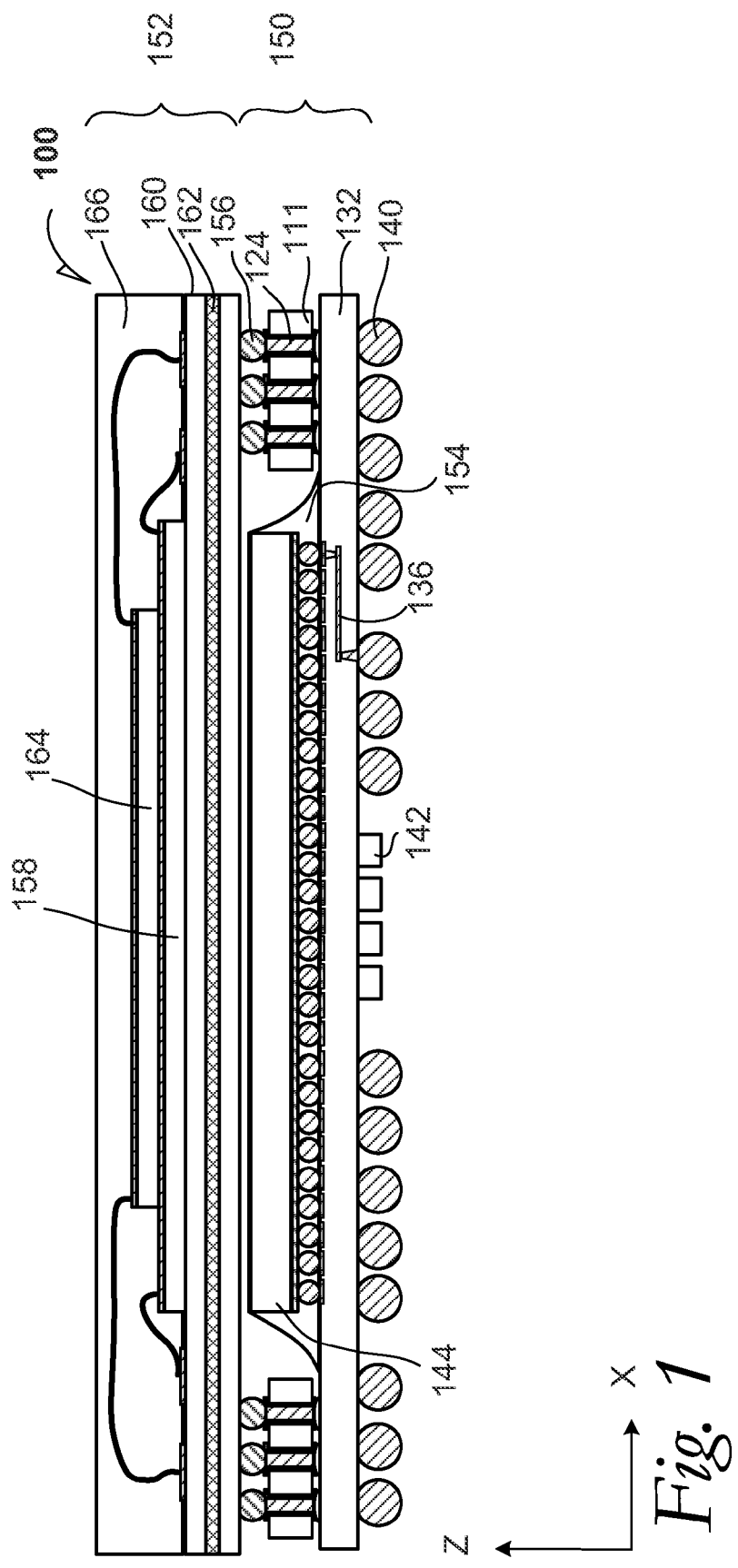

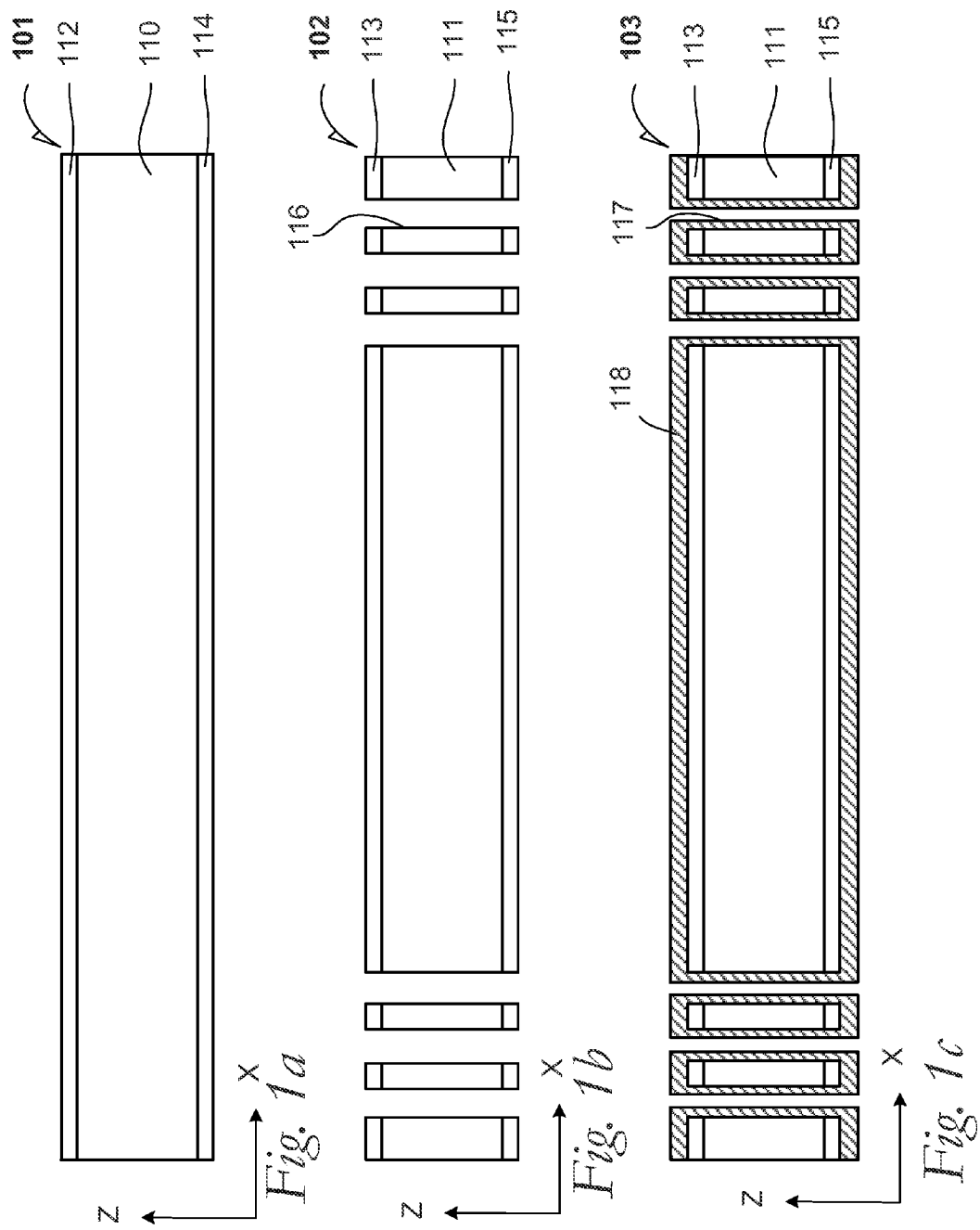

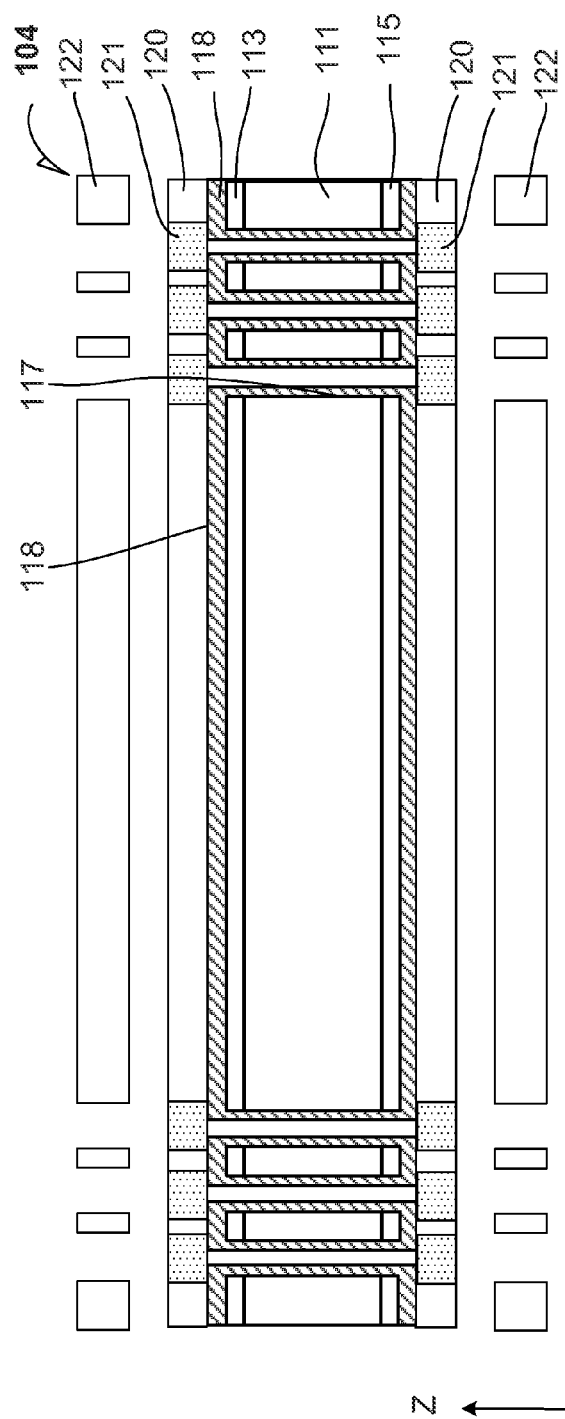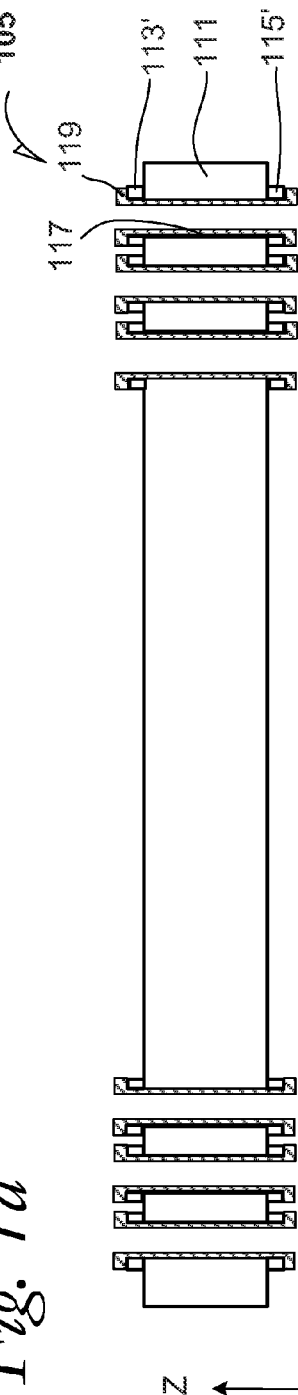

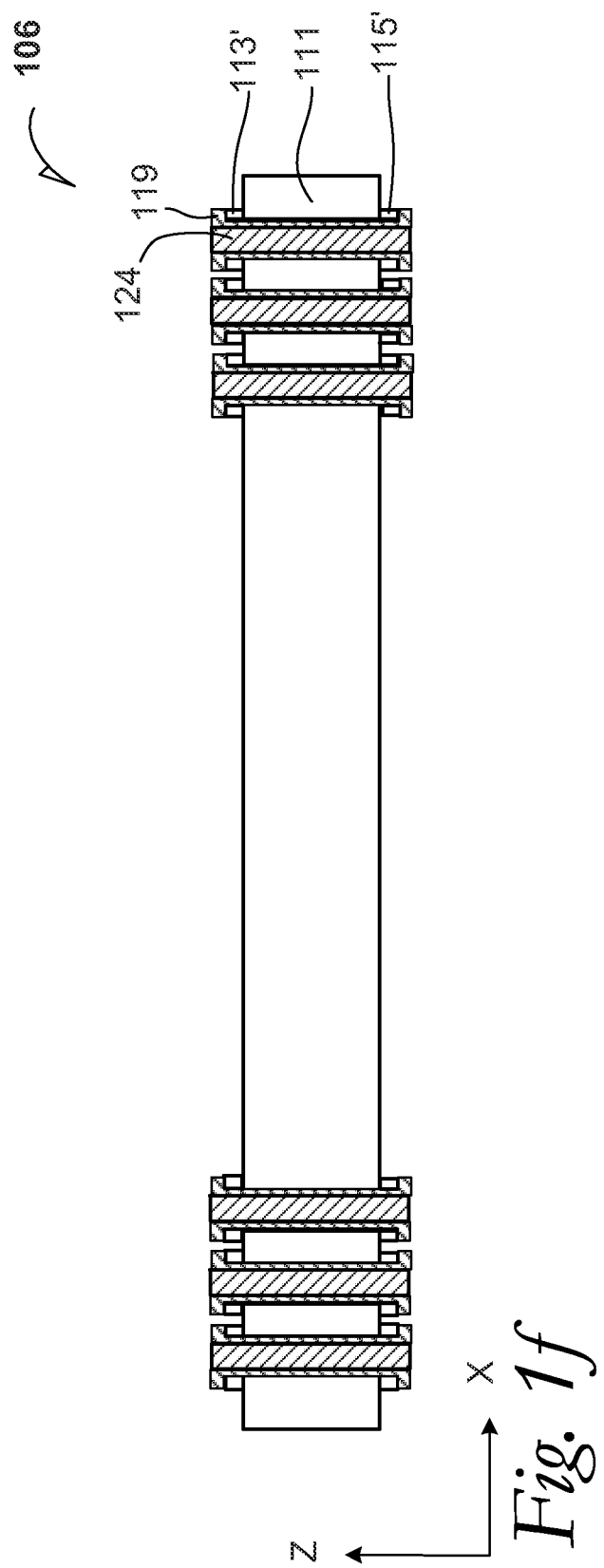

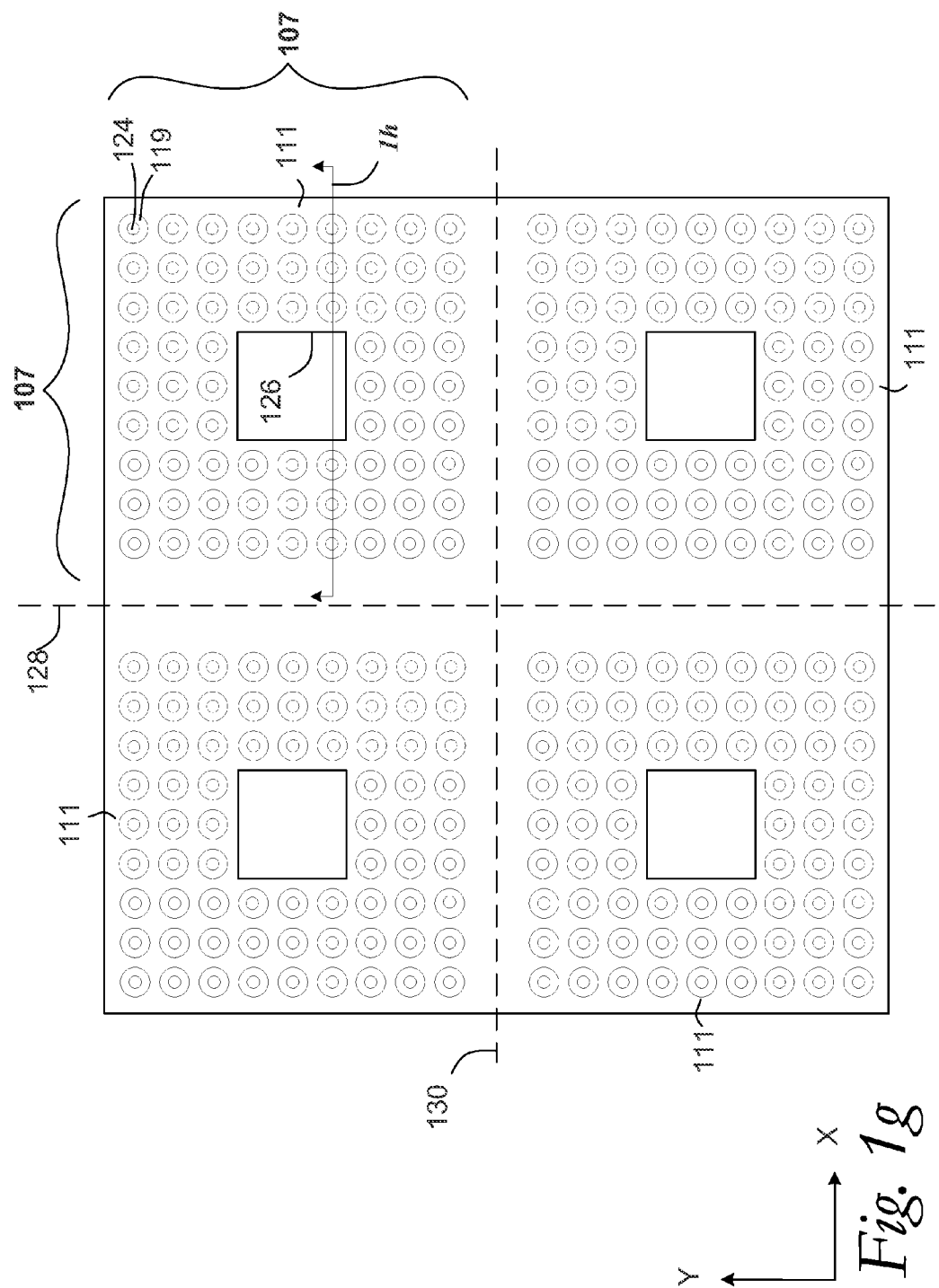

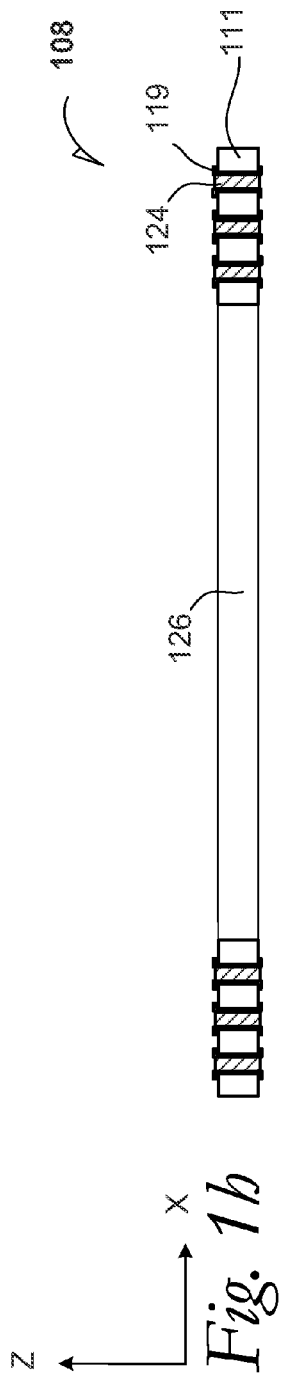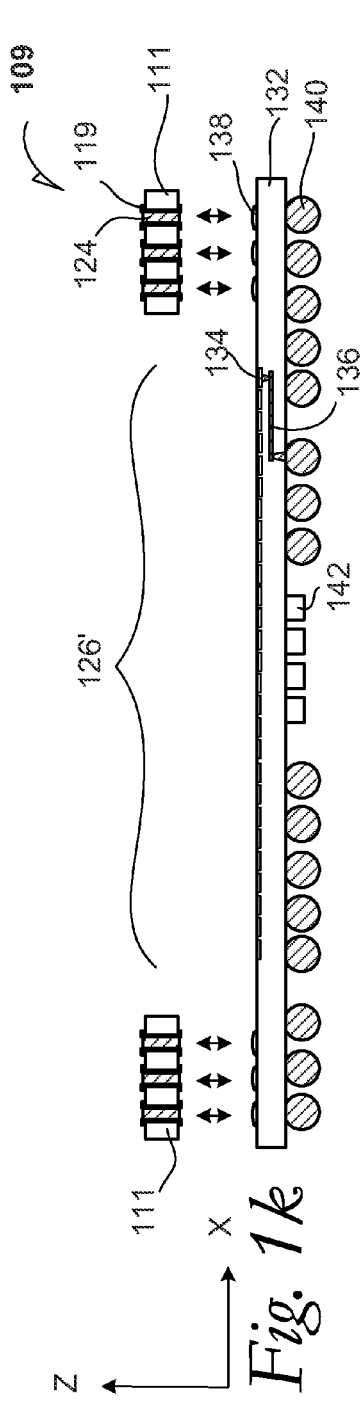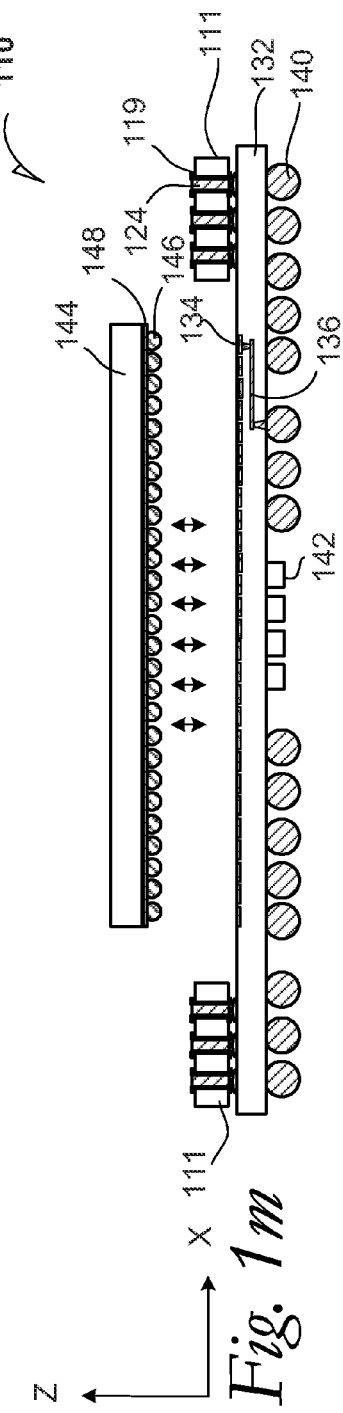

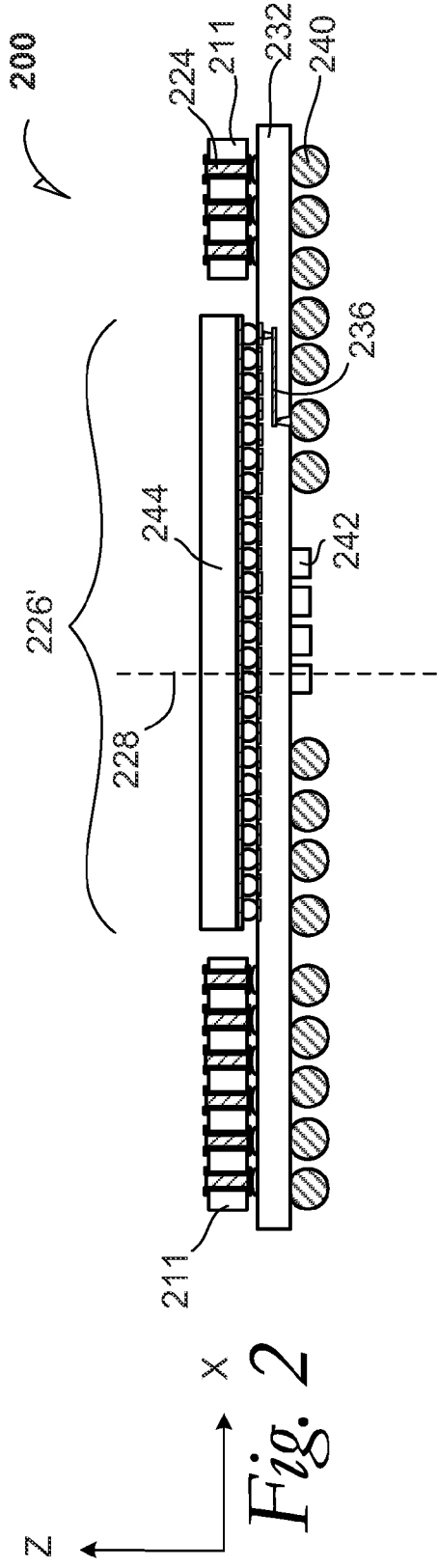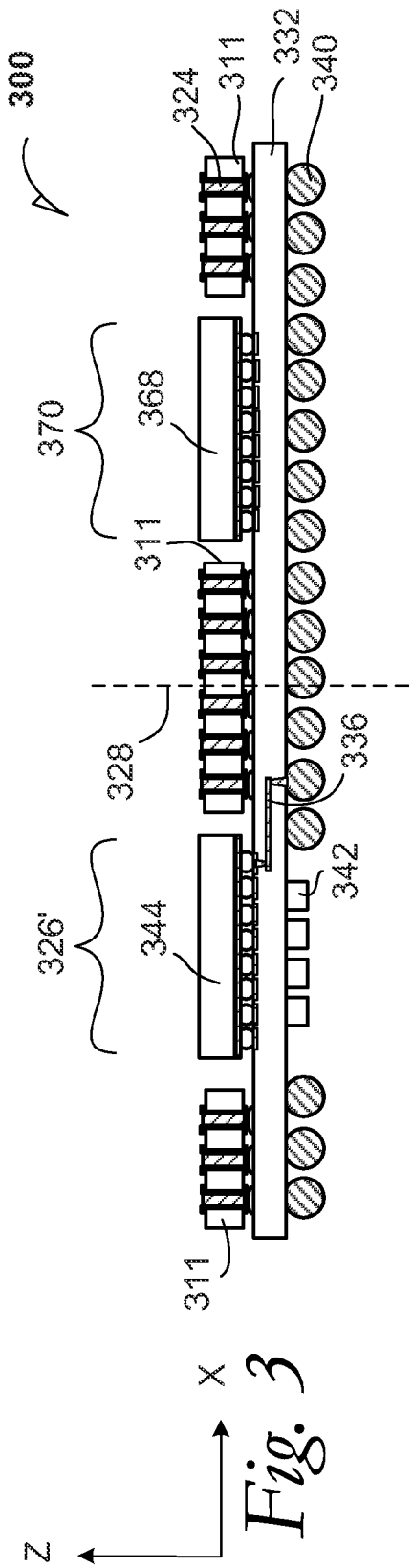

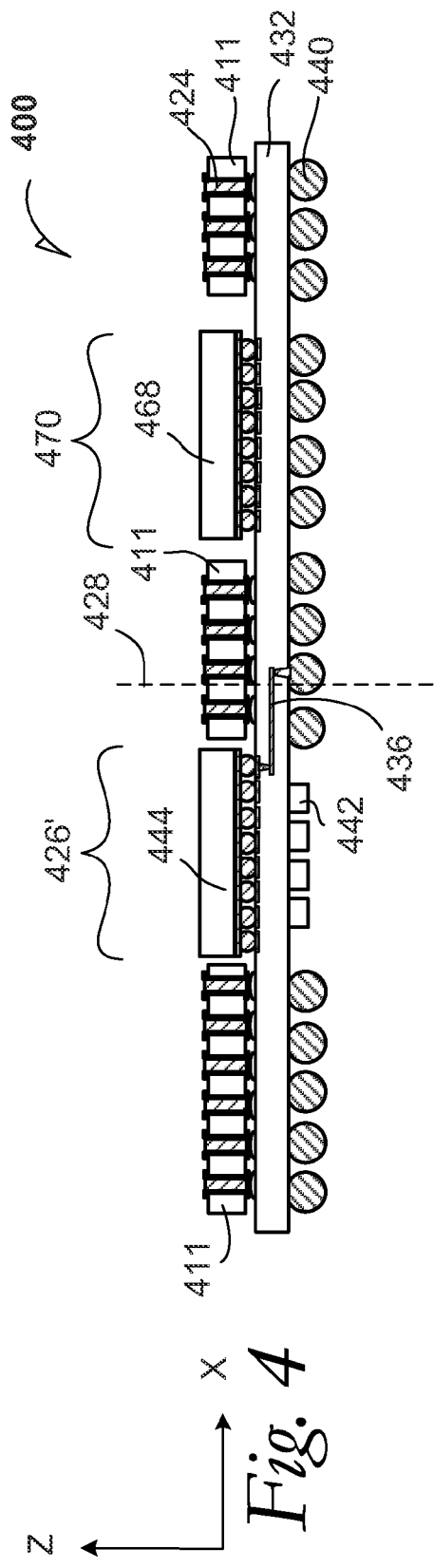
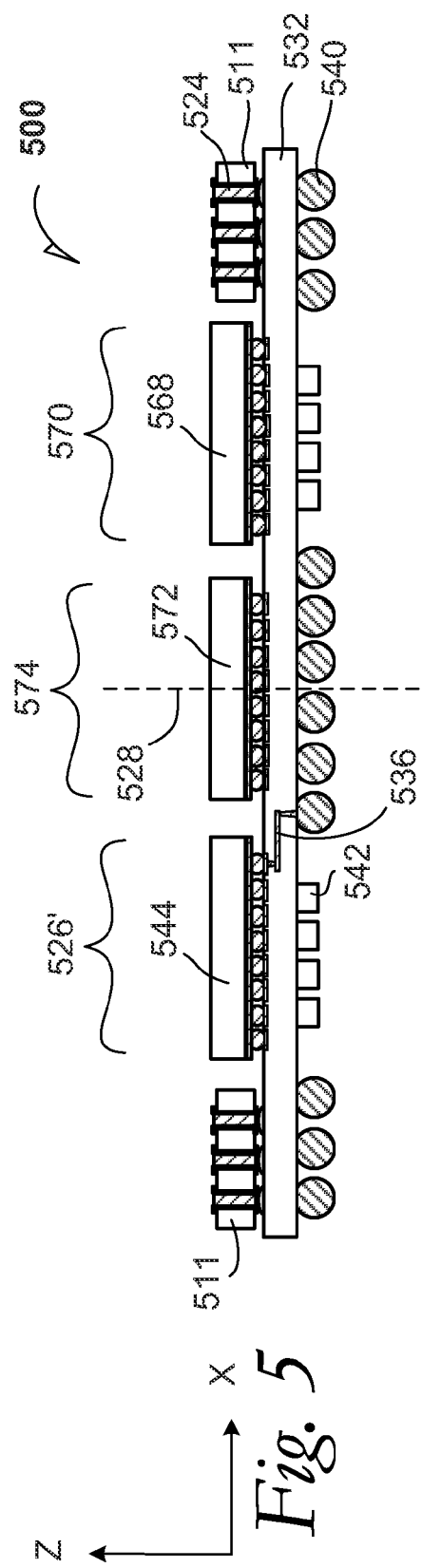

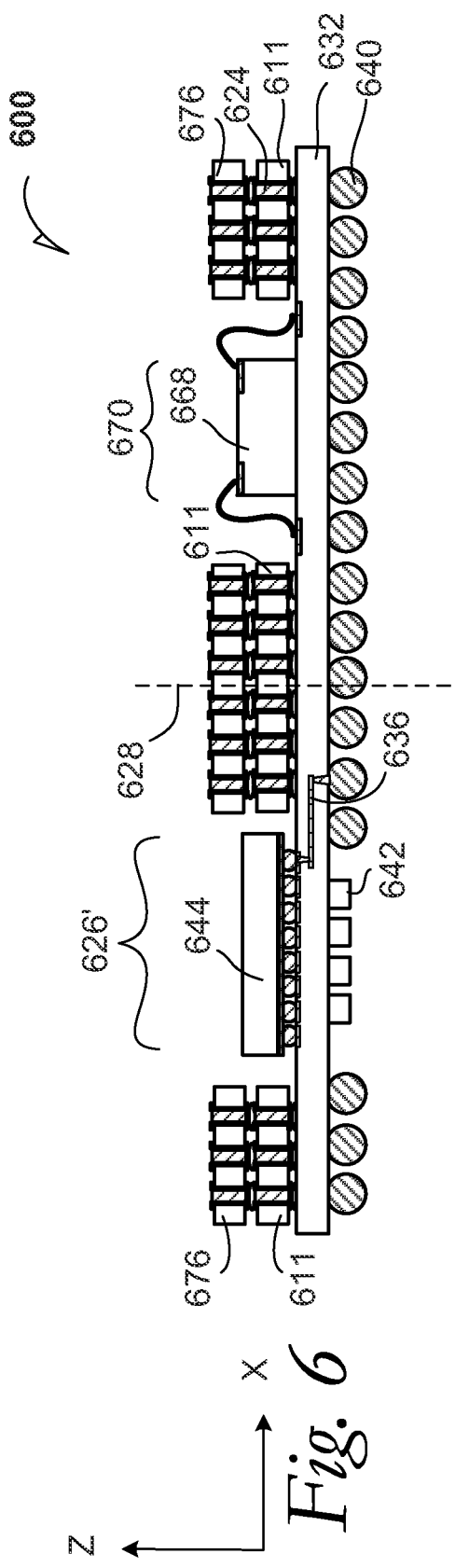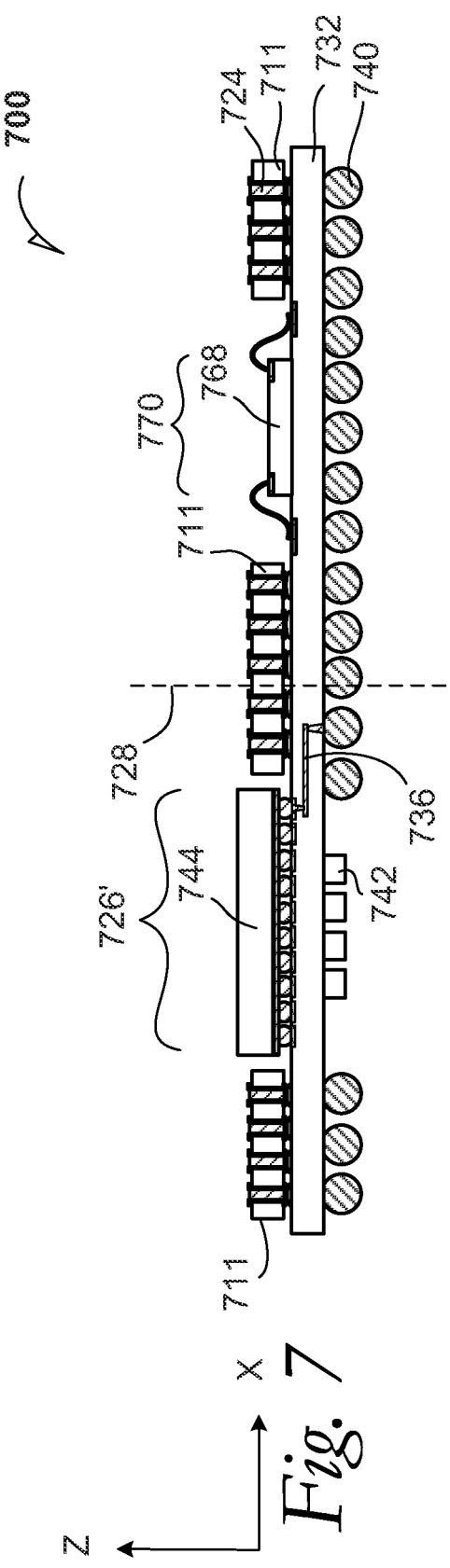

HIGH-DENSITY INTER-PACKAGE CONNECTIONS FOR ULTRA-THIN PACKAGE-ON-PACKAGE STRUCTURES, AND PROCESSES OF FORMING SAME

CROSS-REFERENCES TO RELATED APPLICATIONS

This application is based upon and claims the benefits of the priority for the prior Malaysian Patent Application No. PI 20095412, filed on Dec. 16, 2009, the entire contents of which are incorporated herein by reference.

Disclosed embodiments relate to semiconductor microelectronic devices and processes of packaging them.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 1 is a cross-section elevation of a package-on-package apparatus according to an example embodiment;

FIG. 1a is a cross-section elevation of the apparatus depicted in FIG. 1 during processing according to an example embodiment;

FIG. 1b is a cross-section elevation of the apparatus depicted in FIG. 1a after further processing according to an embodiment;

FIG. 1c is a cross-section elevation of the apparatus depicted in FIG. 1b after further processing according to an embodiment;

FIG. 1d is a cross-section elevation of the apparatus depicted in FIG. 1c after further processing according to an embodiment;

FIG. 1e is a cross-section elevation of the apparatus depicted in FIG. 1d after further processing according to an embodiment;

FIG. 1f is a cross-section elevation of the apparatus depicted in FIG. 1e after further processing according to an embodiment;

FIG. 1g is a top plan of four unsingulated interposer cores after further processing of an exemplary interposer core such as depicted in FIG. 1f according to an embodiment;

FIG. 1h is a cross-section cut-away perspective of the unsingulated interposer core depicted in FIG. 1g, taken along the section line 1h after further processing according to an embodiment;

FIG. 1k is a cross-section elevation of the apparatus depicted in FIG. 1h after further processing according to an embodiment;

FIG. 1m is a cross-section elevation of the apparatus depicted in FIG. 1k after further processing according to an embodiment;

FIG. 2 is a cross-section elevation of a portion of a package-on-package apparatus according to an example embodiment;

FIG. 3 is a cross-section elevation of a portion of a package-on-package apparatus according to an example embodiment;

FIG. 4 is a cross-section elevation of a portion of a package-on-package apparatus according to an example embodiment;

FIG. 5 is a cross-section elevation of a portion of a package-on-package apparatus according to an example embodiment;

FIG. 6 is a cross-section elevation of a portion of a package-on-package apparatus according to an example embodiment;

FIG. 7 is a cross-section elevation of a portion of a package-on-package apparatus according to an example embodiment;

DETAILED DESCRIPTION

Figure 8:
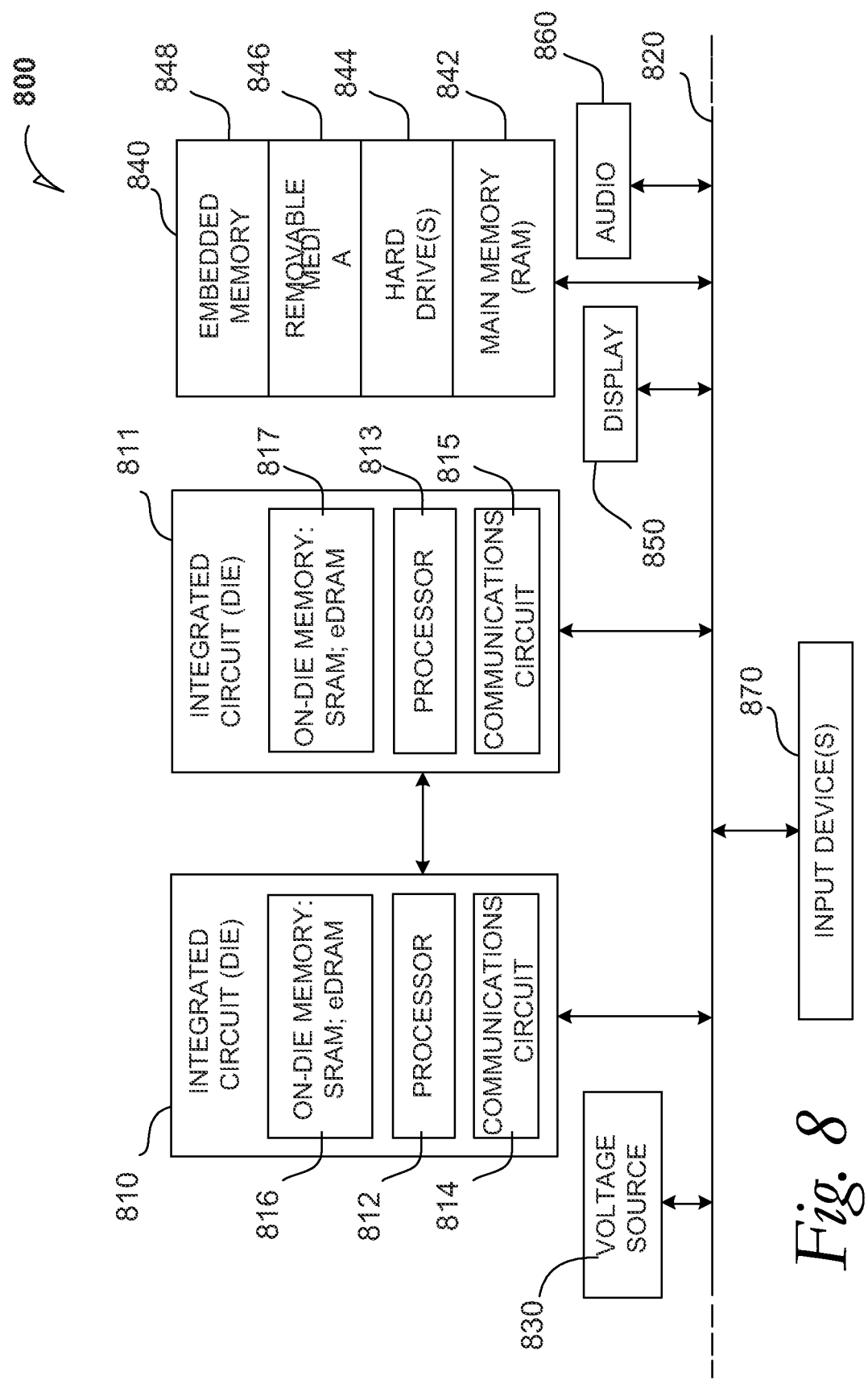
FIG. 8 is a schematic of a computer system according to an embodiment.

Reference will now be made to the drawings wherein like structures may be provided with like suffix reference designations. In order to show the structures of various embodiments more clearly, the drawings included herein are diagrammatic representations of integrated circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

FIG. 1 is a cross-section elevation of a package-on-package (POP) apparatus 100 according to an example embodiment. A patterned interposer core 111 includes a filled via 124 that is formed as set forth herein. The patterned interposer core 111 is part of a chip bottom package 150 that supports a chip top package 152. It can now be appreciated that the filled via 124 allows for a communicative channel between the chip bottom package 150 and the chip top package 152 that avoids solder bridging if mere solder bumps were placed to communicate in the Z-dimension instead of the filled via 124 in the patterned interposer core 111. Consequently, the filled via 124 is useful to achieve the vertical communication need. Similarly, the filled via 124 allows for tighter pitch (illustrated in the X-dimension) between adjacent electrical channels of communication achieved by adjacent filled vias 124 than a mere solder-bump array would achieve.

In an embodiment, pitch between two adjacent vias 124 is in a range from 40 µm to 400 µm. In an embodiment, the pitch between two adjacent vias 124 is in a range from 80 µm to 200 µm. In an embodiment, the height (Z-dimension) of the filled via 124 is in a range from 50 µm to 1,000 µm. In an embodiment, the height of the filled via 124 is in a range from 100 µm to 500 µm. The Table illustrates several pitches of filled vias that are matches with several height embodiments. By way of illustration, the pitch of 40 µm is matched with each height, but it should be understood that the pitch of 40 is also matched to a range of heights between 50 and 1,000 µm. For example, the pitch of 40 µm is also matched to a height range between 200 µm and 800 µm.

| Pitch, μm | Height, μm | | | | | | |
|---|---|---|---|---|---|---|---|
| | 50 | 100 | 200 | 400 | 500 | 800 | 1,000 |
| 40 | X | X | X | X | X | X | X |
| 80 | X | X | X | X | X | X | X |
| 100 | X | X | X | X | X | X | X |
| 200 | X | X | X | X | X | X | X |
| 400 | X | X | X | X | X | X | X |

In an embodiment, the patterned interposer core 111 contains filled vias 124 with a pitch of 40 μm and a height of 1,000 μm. In an embodiment, the patterned interposer core 111 contains filled vias 124 with a pitch of 80 μm and a height of 1,000 μm. In an embodiment, the patterned interposer core 111 contains filled vias 124 with a pitch of 200 μm and a height of 1,000 μm. In an embodiment, the patterned interposer core 111 contains filled vias 124 with a pitch of 400 μm and a height of 1,000 μm. In several embodiments, each above-recited pitch is matched with each recited height.

In an embodiment, the filled via 124 includes additional material such as electrically conductive microfibers. In an embodiment, the filled via 124 includes additional material such as electrically conductive nanofibers. In an embodiment, the filled via 124 includes filler material such as glass, ceramic, carbonaceous material, and organic material in addition to electrically conductive material. The chip bottom package 150 includes a die 144 mounted on a coreless substrate 132 and stiffened by the patterned interposer core 111. The coreless substrate 132 may also be referred to as a direct laser lamination (DLL3) substrate 132. A trace 136 is depicted in simplified form to be in the coreless substrate 132 and within a footprint 126' (FIG. 1k) that is projected thereon by the die 144. In an embodiment, the coreless substrate 132 can be a thin core substrate which is defined as having a substrate core thickness (Z-dimension) in a range from 50 μm to 400 μm.

The die 144 has also been solidified to the coreless substrate 132 by an underfill material 154. Underfilling may be done to an entire array of unsingulated interposer cores 111, followed by singulating such as sawing or a conventional technique.

The chip top package 152 communicates electrically through a POP bump 156 that contacts the filled via 124. In an embodiment, the filled via 124 has a finish layer (not pictured) and is coupled to the POP bump 156 though contact to the finish layer. The POP bump may also be referred to as an inter-package bump 156.

The chip top package 152 is depicted with a top package first die 158 that is disposed upon a mounting substrate 160 such as a core-based board. The core 162 is also illustrated. The top package first die 158 is wire bonded to the mounting substrate according to an embodiment. A top package subsequent die 164 is also depicted above the top package first die 158, and in this embodiment it is disposed above and on the top package first die 158. The chip top package 152 also is encapsulated with an overmold material 166.

FIG. 1a is a cross-section elevation of the apparatus depicted in FIG. 1 during processing according to an example embodiment. The apparatus 101 is being fabricated beginning with an interposer core 110. The interposer core 110 is depicted with a metallic top plating 112 and a metallic bottom plating 114. In an embodiment, the material of the interposer core 110 is the same material that is used as core material for core-based substrates. Consequently, the material of the interposer core 110 produces a stiffness in the interposer structure that is being fabricated. In an embodiment, the interposer core 110 is an organic material such as bismaleimide-triazine (BT) resin. In an embodiment, the metallic platings 112 and 114, respectively are copper or a copper alloy. Other metals may be used for the platings 112 and 114 depending upon a given application need.

FIG. 1b is a cross-section elevation of the apparatus depicted in FIG. 1a after further processing according to an embodiment. The apparatus 102 has been processed such that interconnect channels have been formed from the metallic top plating 112 to the metallic bottom plating 114, one of which interconnect channels is demarcated 116. Processing to form the interconnect channels 116 includes drilling or otherwise forming substantially cylindrical interconnect channels 116 such as by mechanical drilling or laser drilling based upon an applied interposer-grid design. Consequently the interposer core 110 (FIG. 1a) has been processed to become a patterned interposer core 111 and the metallic platings 112 and 114 have been processed to become patterned metallic platings 113 and 115.

FIG. 1c is a cross-section elevation of the apparatus depicted in FIG. 1b after further processing according to an embodiment. The apparatus 103 has been plated by an electroless plating method to form an electroless-plating film 118, which has also formed a thin-channel film 117 within the interconnect channels 116 (FIG. 1b).

FIG. 1d is a cross-section elevation of the apparatus depicted in FIG. 1c after further processing according to an embodiment. The apparatus 104 has been further processed by forming a photoresist 120 and selectively curing through a mask such as a glass mask 122. Cured portions 121 of the photoresist 120 mask off the thin-channel film 117 within the interconnect channels 116.

FIG. 1e is a cross-section elevation of the apparatus depicted in FIG. 1d after further processing according to an embodiment. The apparatus 105 has been stripped of the photoresist 120, and the cured portions thereof 121 to reveal the thin-channel film 117. The electroless-plated film 118, depicted in FIG. 1d has also been reduced to a residual film 119 that was protected under the cured photoresist 121. Similarly, the metallic platings 113 and 115 have been reduced 113' and 115'.

FIG. 1f is a cross-section elevation of the apparatus depicted in FIG. 1e after further processing according to an embodiment. The apparatus 106 is illustrated with the interconnect channels 116 having been filled with an electrical conductor such as copper to form a filled via 124. As depicted, the filled via 124 is made of a metallic-plated interconnect channel and may also be referred to as a plated interconnect channel 119 and 124.

FIG. 1g is a top plan of four unsingulated interposer cores 111 after further processing of an exemplary interposer core such as depicted in FIG. 1f according to an embodiment. The apparatus 107 during processing is depicted in the upper right corner of FIG. 1g. An exemplary residual film 119 and filled via 124 are depicted as part of an interposer core 111. The apparatus 107 also exhibits a recess 126 that communicates entirely through the interposer core 111. The top plan also exhibits two symmetry lines 128 and 130. The first symmetry line 128 displays the four unsingulated interposer cores across the X-dimension and the second symmetry line 130 displays the four unsingulated interposer cores across the Y-dimension. It may now be understood that the illustrated array of four unsingulated interposer cores is one embodiment and larger and smaller arrays may be manufactured.

FIG. 1h is a cross-section cut-away perspective of the unsingulated interposer core 111 depicted in FIG. 1g, taken along the section line 1h after further processing according to an embodiment. The apparatus 108 as cut away depicts the recess 126 along with the interposer core 111 and the filled via 124.

FIG. 1k is a cross-section elevation of the apparatus depicted in FIG. 1h after further processing according to an embodiment. The recess 126 depicted in FIG. 1h projects a recess footprint 126' onto a coreless substrate 132. The coreless substrate 132 is configured with a chip-bonding pad 134 on a die side thereof. The chip-bonding pad 134 is in contact with a trace 136 that is routed beginning within the recess footprint 126', but may also be routed across the coreless substrate 132 including the region beneath the interposer for package routing optimization. The trace 136 is depicted in simplified form for illustrative purposes.

An interposer bump 138 is also disposed on the coreless substrate 132 to mate with the interposer 111 at the filled via 124. The coreless substrate 132 is also bumped on a land side thereof with a land-side bump 140. Where the recess footprint 126' is to contain a processor, a load-upset capacitor 142 may be disposed on the land side of the coreless substrate at a location that may contain a processor within the X-dimension upon the die side according to an exemplary embodiment. It is seen that four load-upset capacitors 142 are mounted on the land side of the coreless substrate 132.

FIG. 1m is a cross-section elevation of the apparatus depicted in FIG. 1k after further processing according to an embodiment. A die 144 is depicted being mounted upon the coreless substrate 132 such that the a die bump 146 will mate to the chip-bonding pad 134 on the die side of the coreless substrate 132. The die 144 also has an active surface with a metallization layer 148 that may includes several levels of metallization including a simple metal-1 (M1) or any number of metallizations up to an M9 or more depending upon a given application need.

As can be seen the interposer 111 becomes a die-containing interposer 111 such that the die 144 and the interposer 111 share space in the XZ-dimensions as illustrated.

Reference is again made to FIG. 1. It can now be appreciated that stiffness to the apparatus 100 is provided by the interposer 111 such that the coreless substrate 132, if it lacks sufficient stiffness in order to get a thinner form factor in the Z-dimension, receives useful stiffness by mating with the interposer 111.

FIG. 2 is a cross-section elevation of a portion of a package-on-package apparatus 200 according to an example embodiment. A patterned interposer core 211 includes a filled via 224 that is formed as set forth in various embodiments in this disclosure. The patterned interposer core 211 is part of a chip bottom package that supports a chip top package.

The chip bottom package includes a die 244 mounted on a coreless substrate 232 and stiffened by the patterned interposer core 211. A trace 236 which can be routed across the coreless substrate 232 is depicted in simplified form for illustrative purposes. The trace 236 may originate within a footprint 226' of the die. Where the die 244 may be a processor, an upset capacitor 242 may be located near the die 244 on the land side of the coreless substrate 232.

In an embodiment, the die 244 is to be solidified to the coreless substrate 232 by an underfill material. Underfilling may be done to an entire array of unsingulated interposer cores 211, followed by singulating such as sawing or a conventional technique.

A symmetry line 228 bisects the coreless substrate 232 and it can be seen that the recess footprint 226' is asymmetrically located with respect to the symmetry line. As a consequence of the asymmetrically located die 244, the interposer core 211 may have an asymmetrically configured number of filled vias 224 such as three at the right of the interposer core 211 and six at the left thereof in an example embodiment. One embodiment of an asymmetrical configuration includes where power is drawn to a chip top package in a POP apparatus, there may be a concentration of filled vias 224 in the interposer core 211 that allows for a concentration of closely located filled vias to supply power. Consequently and as illustrated the six filled vias 224 located at the left are more relative to the three located at the right.

FIG. 3 is a cross-section elevation of a portion of a package-on-package apparatus 300 according to an example embodiment. A patterned interposer core 311 includes a filled via 324 that is formed as set forth in various embodiments in this disclosure. The patterned interposer core 311 is part of a chip bottom package that supports a chip top package.

The chip bottom package includes a first die 344 mounted on a coreless substrate 332 and stiffened by the patterned interposer core 311. A trace 336 which can be routed across the coreless substrate 332 is depicted in simplified form for illustrative purposes. The trace 336 may originate within a footprint 326' of the die. Where the first die 344 may be a processor, an upset capacitor 342 may be located near the first die 344 on the land side of the coreless substrate 332.

In an embodiment, the first die 344 is to be solidified to the coreless substrate 332 by an underfill material. Underfilling may be done to an entire array of unsingulated interposer cores 311, followed by singulating such as sawing or a conventional technique.

A symmetry line 328 bisects the coreless substrate 332 and it can be seen that the recess footprint 326' is asymmetrically located with respect to the symmetry line, but a subsequent die 368 is located in a subsequent recess such that a subsequent recess footprint 370 is also projected onto the coreless substrate 332. As a consequence of the asymmetrically located first die 344, the interposer core 311 may house the subsequent die 368, which may be part of a chipset with the first die 344 such as for a smart phone. One embodiment of an asymmetrical configuration includes where power is drawn to a chip top package in a POP apparatus, there may be a processor first die 344 and a specialty subsequent die 368 such as a graphics processor in the interposer core 311. Consequently and as illustrated the six filled vias 324 located at the left are more relative to the three located at the right.

It can be observed that symmetrically configured filled vias 324 are bisected by the symmetry line 328 such there are four groups of three with respect to the symmetry line 328.

FIG. 4 is a cross-section elevation of a portion of a package-on-package apparatus 400 according to an example embodiment. A patterned interposer core 411 includes a filled via 424 that is formed as set forth in various embodiments in this disclosure. The patterned interposer core 411 is part of a chip bottom package that supports a chip top package.

The chip bottom package includes a first die 444 mounted on a coreless substrate 432 and stiffened by the patterned interposer core 411. A trace 436 which can be routed across the coreless substrate 432 is depicted in simplified form for illustrative purposes. The trace 436 may originate within a footprint 426' of the die. Where the first die 444 may be a processor, an upset capacitor 442 may be located near the first die 444 on the land side of the coreless substrate 432.

In an embodiment, the first die 444 is to be solidified to the coreless substrate 432 by an underfill material. Underfilling may be done to an entire array of unsingulated interposer cores 411, followed by singulating such as sawing or a conventional technique.

A symmetry line 428 bisects the coreless substrate 432 and it can be seen that the recess footprint 426' is asymmetrically located with respect to the symmetry line 428, but a second die 468 is located in a second recess such that a second recess footprint 470 is also projected onto the coreless substrate 432. As a consequence of the asymmetrically located first die 444 and the second, the interposer core 411 may house the second die 468, which may be part of a chipset with the first die 444 such as for a smart phone. One embodiment of an asymmetrical configuration includes where power is drawn to a chip top package in a POP apparatus, there may be a processor first die 444 and a specialty second die 468 in recesses formed in the interposer core 411. Consequently and as illustrated the six filled vias 424 located at the left are more relative to the three located at the right, and four further filled vias 424 are locate in a group that is intersected by the symmetry line 428.

FIG. 5 is a cross-section elevation of a portion of a package-on-package apparatus 500 according to an example embodiment. A patterned interposer core 511 includes a filled via 524 that is formed as set forth in various embodiments in this disclosure. The patterned interposer core 511 is part of a chip bottom package that supports a chip top package.

The chip bottom package includes a first die 544 mounted on a coreless substrate 532 and stiffened by the patterned interposer core 511. A trace 536 which can be routed across the coreless substrate 532 is depicted in simplified form for illustrative purposes. The trace 536 may originate within a footprint 526' of the die 544. Where the first die 544 may be a processor, an upset capacitor 542 may be located near the first die 544 on the land side of the coreless substrate 532.

In an embodiment, the first die 544 is to be solidified to the coreless substrate 532 by an underfill material. Underfilling may be done to an entire array of unsingulated interposer cores 511, followed by singulating such as sawing or a conventional technique.

A symmetry line 528 bisects the coreless substrate 532 and it can be seen that the recess footprint 526' is asymmetrically located with respect to the symmetry line 528, but a second die 568 and a subsequent die 572 are located in the recess such that a second recess footprint 570 and a subsequent recess footprint 574 are also projected onto the coreless substrate 532. As a consequence of the asymmetrically located first die 544 and the second- and subsequent dice 568 and 572, respectively, the interposer core 511 may house the second die 568 and the subsequent die 572, which may be part of a chipset with the first die 544 such as for a two-processor (544 and 568) and a memory module (572) apparatus 500. As illustrated, there is symmetry across the symmetry line 528 with the two dice 544 and 568, and the second die 572 being substantially symmetrically bisected.

FIG. 6 is a cross-section elevation of a portion of a package-on-package apparatus 600 according to an example embodiment. A patterned interposer first core 611 includes a filled via 624 that is formed as set forth in various embodiments in this disclosure. The patterned interposer first core 611 is part of a chip bottom package that supports a chip top package. A patterned interposer second core 676 is disposed on the patterned interposer first core 611. It will now be clear that the pitch- and height combinations set forth in the above Table are also applicable to any combinations of two heights. For example, the height of the patterned interposer first core 611 and the patterned interposer second core 676 equals 1,050 in an embodiment.

The chip bottom package includes a first die 644 mounted on a coreless substrate 632. A trace 636 which can be routed across the coreless substrate 632 is depicted in simplified form for illustrative purposes. The trace 636 may originate within a footprint 626' of the first die 644. Where the first die 644 may be a processor, an upset capacitor 642 may be located near the first die 644 on the land side of the coreless substrate 632.

A symmetry line 628 bisects the coreless substrate 632 and it can be seen that the recess footprint 626' is asymmetrically located with respect to the symmetry line 628, but a second die 668 has a taller (Z-dimension) form factor than the first die 644 such that the patterned interposer second core 676 is disposed on the patterned interposer first core 611 to accommodate the form factor. The second die 668 is located in a second recess such that a second recess footprint 670 is also projected onto the coreless substrate 632. As a consequence of the asymmetrically located first die 644 and the second die 668, the patterned interposer first- and subsequent cores 611 and 676 may house the second die 668, which may be part of a chipset with the first die 644 as a processor 644 and the second die 668 as an RF die 668. As illustrated, there is symmetry across the symmetry line 628 with the two dice 644 and 668.

FIG. 7 is a cross-section elevation of a portion of a package-on-package apparatus 700 according to an example embodiment. A patterned interposer core 711 includes a filled via 724 that is formed as set forth in various embodiments in this disclosure. The patterned interposer core 711 is part of a chip bottom package that supports a chip top package.

The chip bottom package includes a first die 744 mounted on a coreless substrate 732. A trace 736 which can be routed across the coreless substrate 732 is depicted in simplified form for illustrative purposes. The trace 736 may originate within a footprint 726' of the first die 744. Where the first die 744 may be a processor, an upset capacitor 742 may be located near the first die 744 on the land side of the coreless substrate 732.

A symmetry line 728 bisects the coreless substrate 732 and it can be seen that the first recess footprint 726' is asymmetrically located with respect to the symmetry line 728, and a second die 768 is wire-bonded to coreless substrate 732. The second die 768 is located in a second recess such that a second recess footprint 770 is also projected onto the coreless substrate 732. As a consequence of the asymmetrically located first die 744 and the second die 768, the patterned interposer core 711 may house the second die 768, which may be part of a chipset with the first die 744 as a processor 744 and the second die 768 as an RF die 768.

As illustrated, there is symmetry across the symmetry line 728 with the two dice 744 and 768, but the patterned interposer core 711 is asymmetrically laid out with respect to the symmetry line 728. For example, there are four filled vias 724 to the left of the symmetry line in one group, five filled vias 724 that is intersected by the symmetry line in another group, and three filled vias 724 to the right of the symmetry line in yet another group.

It should now be understood that a top package such as the top package 152 depicted in FIG. 1, may be applied to any of the apparatus embodiments and their variations depicted in FIGS. 2, 3, 4, 5, 6, and 7 along with their equivalents.

FIG. 8 is a schematic of a computer system 800 according to an embodiment. The computer system 800 (also referred to as the electronic system 800) as depicted can embody a chip-containing interposer core according to any of the several disclosed embodiments and their equivalents as set forth in this disclosure. The computer system 800 may be a mobile device such as a netbook computer. The computer system 800 may be a mobile device such as a wireless smart phone.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems. In an embodiment, the processor 810 includes on-die memory 816 such as static random-access memory (SRAM). In an embodiment, the processor 810 includes embedded on-die memory 816 such as embedded dynamic random-access memory (eDRAM).

In an embodiment, the integrated circuit 810 is doubled dual integrated circuit 811 such as a second die. The dual integrated circuit 811 includes a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the chip-containing interposer core apparatus according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including a chip-containing interposer core apparatus according to any of the several disclosed embodiments and their equivalents, an electronic system, a computer system, one or more methods of fabricating an integrated circuit, and one or more methods of fabricating an electronic assembly that includes a chip-containing interposer core apparatus according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed chip-containing interposer core apparatus embodiments and their equivalents.

Figure 9:
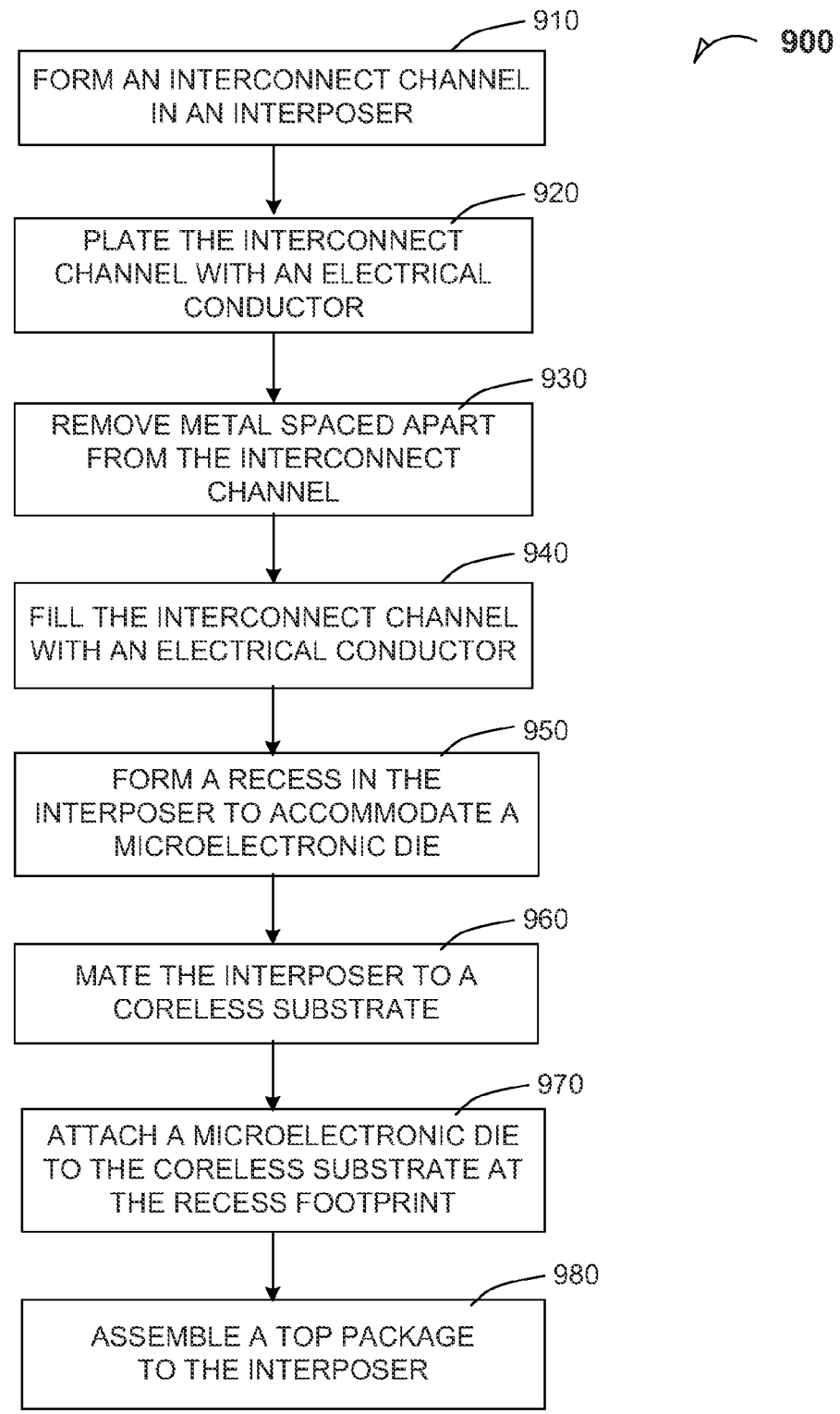
FIG. 9 is a process and method flow diagram according to an example embodiment.

FIG. 9 is a process and method flow diagram according to several embodiments.

At 910, the process includes forming an interconnect channel in an interposer. In a non-limiting example embodiment, a cylindrical interconnect channel is formed in a copper-clad interposer that is a core-material structure.

At 920, the process includes plating the interconnect channel with an electrical conductor. In a non-limiting example embodiment, electroless plating of copper into the interconnect channel is carried out that uses the metal cladding.

At 930, the process includes removing metal that is spaced apart from the interconnect channel. In a non-limiting example embodiment, a mask is patterned that protects the interconnect channel and an etch removes the cladding and the incidental electroless plating.

At 940, the process includes filling the interconnect channel with an electrical conductor. In a non-limiting example embodiment, a filled via is formed by electroplating to fill the interconnect channel.

At 950, the process includes forming a recess in the interposer to accommodate a microelectronic die. In a non-limiting example embodiment, a first recess and a subsequent recess are formed in the interposer.

At 960, a method embodiment includes mating the interposer to a coreless substrate. In a non-limiting example embodiment, a trace in the coreless substrate is exposed at a bond pad through the interposer recess during mating the interposer to the coreless substrate. In an embodiment, the method commences and terminates at 960.

At 970, the method includes attaching a microelectronic die to the coreless substrate at the recess footprint. It may be understood that the die has a footprint and the interposer recess has a footprint, but they may be considered essentially the same where a single die is attached in a given interposer recess. In an embodiment, the method commences and terminates at 970. In an embodiment, the method commences at 960 and terminates at 970.

At 980, the method includes assembling a top package to the interposer. In a non-limiting embodiment, any die-bearing top package is assembled to any interposer and coreless substrate embodiment and their equivalents.

Although a device under test may refer to a processor chip, a processor chip or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An apparatus, comprising:
   a coreless mounting substrate;
   an interposer disposed on the coreless mounting substrate, wherein the interposer includes:
      a die side and a land side that is parallel planar to the die side;
      a chip recess that communicates to the die side and the land side, wherein the chip recess projects a footprint onto the coreless mounting substrate;
      an interconnect channel that passes through the interposer, wherein the interconnect channel is electrically coupled to the coreless substrate by contact with a substrate bump; and
   a trace in the coreless mounting substrate, wherein the recess footprint is asymmetrically located with respect to a symmetry line that equally bisects the coreless substrate.

2. An apparatus, comprising:
   a coreless mounting substrate;
   an interposer disposed on the coreless mounting substrate, wherein the interposer includes:
      a die side and a land side that is parallel planar to the die side;
      a chip recess that communicates to the die side and the land side, wherein the chip recess projects a footprint onto the coreless mounting substrate;
      an interconnect channel that passes through the interposer, wherein the interconnect channel is electrically coupled to the coreless substrate by contact with a substrate bump; and
   a trace in the coreless mounting substrate, wherein the recess is a first recess, the apparatus further including:
      a second recess spaced apart from the first recess, wherein the second recess communicates to the die side and the land side; and
   wherein the first recess footprint is asymmetrically located with respect to a symmetry line that equally bisects the coreless substrate.

3. An apparatus, comprising:
   a coreless mounting substrate;
   an interposer disposed on the coreless mounting substrate, wherein the interposer includes:
      a die side and a land side that is parallel planar to the die side;
      a chip recess that communicates to the die side and the land side, wherein the chip recess projects a footprint onto the coreless mounting substrate;
      an interconnect channel that passes through the interposer, wherein the interconnect channel is electrically coupled to the coreless substrate by contact with a substrate bump; and
   a trace in the coreless mounting substrate, wherein the recess is a first recess, the apparatus further including:
      a second recess spaced apart from the first recess, wherein the second recess communicates to the die side and the land side;
      a first chip disposed on the coreless substrate in the first recess; and
   a second chip disposed on the coreless substrate in the second recess, wherein the second chip is wire-bonded to the coreless substrate.

* * * * *